United States Patent [19]

Sirinyan et al.

[11] Patent Number: 4,542,074
[45] Date of Patent: Sep. 17, 1985

[54] SURFACE METALLIZED SEMICONDUCTORS

[75] Inventors: Kirkor Sirinyan; Rudolf Merten, both of Leverkusen; Gerhard D. Wolf, Dormagen; Henning Giesecke, Cologne; Uwe Claussen; Harold Ebneth, both of Leverkusen, all of Fed. Rep. of Germany

[73] Assignee: Bayer Aktiengesellschaft, Leverkusen, Fed. Rep. of Germany

[21] Appl. No.: 618,973

[22] Filed: Jun. 11, 1984

Related U.S. Application Data

[62] Division of Ser. No. 457,554, Jan. 13, 1983, Pat. No. 4,472,458.

[30] Foreign Application Priority Data

Jan. 27, 1982 [DE] Fed. Rep. of Germany ....... 3202484

[51] Int. Cl.⁴ .......................... B32B 15/04; B05D 5/12
[52] U.S. Cl. ...................................... 428/450; 427/92; 427/443.1; 428/457; 428/470
[58] Field of Search ....................... 427/92, 75, 74, 88, 427/89, 98, 443.1, 304, 305, 438; 428/457, 450, 470; 29/472

[56] References Cited

U.S. PATENT DOCUMENTS

| | | | |
|---|---|---|---|
| 3,523,038 | 8/1970 | Sanders | 427/92 X |
| 3,890,455 | 6/1975 | Ballas et al. | 427/92 X |
| 4,359,487 | 11/1982 | Schneider | 427/75 |

*Primary Examiner*—Thomas J. Herbert
*Attorney, Agent, or Firm*—Sprung, Horn, Kramer & Woods

[57] ABSTRACT

The firmly adhesive metallization, in particular partial metallization, of the surface of semiconductors is possible, without pickling, by carrying out the activation with organometallic compounds of metals of the I and VIII Secondary Groups of the Periodic Table of Elements, then reducing in a conventional manner and metallization without current.

3 Claims, No Drawings

SURFACE METALLIZED SEMICONDUCTORS

This is a division of application Ser. No. 457,554, filed Jan. 13, 1983, now U.S. Pat. No. 4,472,458.

BACKGROUND OF THE INVENTION

The term "semiconductors" is understood as designating elements, compounds or alloys, the specific electrical resistance of which lies between that of metals and that of insulators, i.e. values of from $10^{-4}$ to $10^{+12}\Omega\cdot$cm.

Conventional semiconductors consist of silicon, germanium, gallium and arsenic. Moreover, compound semiconductors which are composed of at least two elements are repeatedly described in the literature, for example $A^{III} B^{V}$ compounds which consist of elements of the III and V Main Groups or $A^{II} B^{VI}$ compounds which consist of elements of the II and VI Main groups of the Periodic Table of Elements.

Recently, semiconductors have become very significant in commercial terms for electronic and electric construction elements, such as luminescence diodes. Hall probes, capacitors, solar cells, n-p-doped transistors, field effect transistors, bipolar integrated transistors, thyristors or information stores.

Semiconductors which are used as electronic or electric elements frequently have to be provided with an electrically conducting layer. An electrically conducting or ferromagnetic layer may be applied, for example by high vacuum evaporation with metals or by vacuum sputtering with metal oxides. Disadvantages of the resulting products include a poor abrasion resistance and insufficient regularity of the electric and magnetic properties, which are caused by a low adhesiveness and hardness, and by an irregular layer thickness of the metal layer. Moreover, the known metallization processes are labour-intensive and incapable of producing the desirable fine electrical printed lines which have a complicated geometrical structure, during the partial metallization of electrical semiconductors. An object of the present invention is to provide semiconductors with a firmly adhering metal layer, without changing the chemical and physical properties of the semiconductors.

This object is achieved by depositing metals on the surface of the electrical semiconductor by a particular currentless, chemical process, optionally using suitable masks, and the deposited metal may then be reinforced by galvanization.

In currentless chemical metallization processes, the surface of the substrate to be metallized is firstly activated, for which purpose elements of the I and VIII Secondary Groups of the Periodic Table are used, for example silver, copper, gold, platinum and, preferably, palladium, which are used as salt solutions (ionic process) or as sols (colloidal process). Activation is followed by reduction of the precious metal ions, if they are still present, after which metallization is carried out in a metallization bath, for example a nickel bath. The substrate surface must always be pickled, for example using chromosulphuric acid or other antioxidants before these processes, so that the metal layer adheres effectively to the substrate surface after activation and metallization. A pickling process of this type cannot be used for semiconductors, due to the irreversible change in important properties, for example in the creep resistance of the electrical surface resistance, in the light absorption and in the light perviousness.

SUMMARY OF THE INVENTION

It has now been found that it is possible to metallize surfaces of semiconductors without pickling when activation is carried out using organometallic compounds of metals of the elements of group IB and VIII of the periodic table. After activation, the organometallic compounds are then reduced to the metal and metallization is then carried out, for example nickel-plating using a conventional metallization bath.

Thus, the present invention provides semiconductors which are metallized on the surface, characterised in that the metal layer is applied, without previous pickling, by activation using organometallic compounds of metals of the elements of group IB and VIII of the periodic table, by reduction and currentless wet-chemical metallization.

The present invention also provides a process for the production of semiconductors metallized on the surface, characterised in that organometallic compounds of elements of the elements of group IB and VIII of the periodic table are applied to the semiconductor surface, without previous pickling, the organometallic compounds are reduced and the semiconductor surface is exposed to a metallization bath for currentless metallization.

By the process, semiconductor surfaces may in particular be partially metallized, for example in the form of printed lines.

The process is especially suitable for the metallization of photo-voltaic elements.

DETAILED DESCRIPTION OF THE INVENTION

Photo-voltaic elements, for example solar cells, are capable of directly converting sunlight into electrical energy. During irradiation with light, an internal electrical field is produced in the cells, and the simultaneously forming positive and negative charge carriers are separated spatially from each other in the electrical field. In order to use the photo-electric current, the separated charge carriers have to be diverted to a consumption resistance via suitable contacts and electrical printed lines. These contacts which are applied as a line pattern on the side of the photo-voltaic cell facing the radiation are required to divert as far as possible all the resulting charge carriers in as small a covering as possible of the surface of the photo-voltaic element. According to the present invention, this is possible to a much greater extent than with former processes, because it has hitherto been impossible to apply extremely fine contacts having sufficient conductivity on the surface of the photo-voltaic cell.

Semiconductors based on gallium arsenide are particularly suitable photo-voltaic elements.

Preferred possibilities of applying the activators to the semiconductor surface include printing, spraying, stamping or dip-coating. Of course, the semiconductor surface to be metallised may be provided with a template, then activated according to the present invention in an activation bath, metallized in a conventional chemical, metallization bath and freed from the template in a chemical or physical manner.

The groups of the organic moiety of the organometallic compound which are necessary for the metal bond of the organometallic compounds are known. For example, they include C—C— or C—N-double and triple bonds and groups which may form a chelate complex, for example —OH—, —SH—, —CO—, —CS— or —COOH groups.

In addition to monomeric organometallic compounds, oligomeric, polymeric and prepolymeric $\pi$- and/or chelate compounds of elements of the elements of group IB and VIII of the periodic table are also particularly suitable which are capable of forming a film, for example under electron radiation, $\gamma$ radiation, light radiation or by heating. After the thin film has dried on the semiconductor surface, the organometallic compounds are coverted to free metal by reducing agents, for example those of the chemical metallization bath. These metal particles allow a reductive metal deposition in the chemical metallization bath. During this operation, an additional treatment of the activation layer in the $Sn^{2+}$ bath to sensitize the catalyst is unnecessary, which means that the chemical metallization process is reduced to two steps, namely the application of the activation film to the semiconductor surface and the chemical metallization of the substrate surface with the metallization bath containing the reducing agent.

Thus, for example resins mixed with 4-cyclohexene-1,2-carboxylic acid anhydride-palladium dichloride, or melamine resin precursors may be applied as a thin coating to substrate surfaces, for example by printing or stamping, may be hardened and partially metallised in chemical metallization baths.

In order to produce a good adhesion or contacting, the organometallic compounds preferably carry another functional group in addition to the groups necessary for the metal bond.

The following are particularly suitable for chemically anchoring the activator to the semiconductor surface: functional groups, such as carboxylic acids groups, carboxylic acid halide groups, carboxylic acid anhydride groups, ester groups, amide and imide groups, aldehyde and ketone groups, ether groups, sulphonamide groups, sulphonic acid groups and sulphonate groups, sulphonic acid halide groups, sulphonic acid ester groups, halogen-containing heterocyclic radicals, such as chlorotriazinyl-, -pyrazinyl-, -pyrimidinyl- or -quinoxalinyl groups, activated double bonds, as in the case of vinyl sulphonic or acrylic acid derivatives, amino groups, hydroxyl groups, isocyanate groups, olefin groups and acetylene groups, as well as mercapto groups and epoxide groups, also longer-chain alkyl or alkenyl radicals from $C_8$, in particular olefin, linolein, stearin or palmitin groups.

If anchoring does not take place by a chemical reaction, the adhesiveness may also be caused by adsorption of the organometallic activators on the semiconductor surface, hydrogen bridge bonds or van der Waals forces, for example, being included as causes of adsorption.

Functional groups, such as carboxylic acid groups and carboxylic acid anhydride groups, are particularly suitable for anchoring the activator to the semiconductor surface by adsorption.

It is appropriate to co-ordinate the functional groups causing adsorption with the respective semiconductor.

The process is more preferably carried out using organometallic monomeric, oligomeric, polymeric and prepolymeric compounds of the elements Pd, Pt, Au and Ag, because these elements have a strong catalytic effect and do not give rise to chemical or physical changes in the semiconductors under the reaction conditions.

Of course, mixtures of these compounds may also be used to activate semiconductors. The organometallic compounds are particularly used in the form of a solution or suspension in an organic solvent. The concentration or organometallic compound should be from 0.01 to 15 g per liter, but in particular cases, it may also fall below or above this range. The following are particularly suitable as organic solvents: polar, protic and aprotic solvents, such as methylene chloride, chloroform, 1,1,1-trichloroethane, trichloroethylene, perchloroethylene, acetone, methylethyl ketone, butanol, ethylene glycol and tetrahydrofuran.

Of course, mixtures of the above-mentioned solvents and blends with other solvents, such as naphtha, ligroin and toluene, may also be used.

Solutions are preferably used.

In the process according to the present invention, the surface of the semiconductors to be metallised is wetted with these solutions, the duration of treatment preferably lasting from 1 second to 85 minutes. After wetting, the organic solvent is removed.

The thus-activated surfaces may be used directly for currentless metallization.

It is advisable to observe the following parameters when carrying out the process:

The activators for chemical metallisation should be soluble or should form a suspension in conventional solvents, for example methanol, ethanol, n-butanol, methylethyl ketone, toluene and n-hexane.

The solvents should be easy to remove and should not result in chemical decomposition of the organometallic compounds.

The activators suitable for chemical metallisation should not lead to poisoning of the chemical metallisation bath.

The semiconductors to be metallised should not poison the chemical metallization baths.

The organometallic compounds should not diffuse into the semiconductors.

The activators fixed to the semiconductor surface should not have an electrically insulating effect.

In order to increase the adhesion of the reductively deposited metal layer on the semiconductor surface, the test body may be tempered, optionally under elevated pressure.

In order to achieve optimum contacting, the layer thickness of the reductively deposited metal should be from 0.01 to 3.0 $\mu$m.

Activation of the semiconductors for chemical metallization may be carried out at a temperature of from $-80°$ to $+120°$ C., a temperature of from $+10°$ to $+40°$ C. being particularly preferred.

EXAMPLE 1

A $2 \times 2$ cm square of a photo-voltaic element based on n- and p-doped silicon is activated at room temperature over a period of 30 seconds in an activation bath consisting of 1.4 g of isobutyl vinyl ether palladium dichloride in 1 liter of 1,1,1-trichloroethane. The surface accessible to light is covered with a mask which has free comb-shaped lines about 2 $\mu$m wide, and stamped with 10%, by weight, solution of styrene butadiene copolymer in methylene chloride. After the lacquer layer has dried, the thus-activated plate is nickel-plated without current in an aqueous nickel-plating bath which, in 1 liter, contains 3.5 g of dimethylaminoborane, 30 g of nickel chloride and 10 g of citric acid, and is adjusted to pH 8.2 with concentrated ammonia solution, the nickel-plating being carried out at room temperature for 15 minutes.

After about 2 minutes, the free lines darken and, after about 6 minutes, a lustrous layer is observed. The template is then dissolved with methylethyl ketone, the solvent is evaporated, the semiconductor surface is wetted by immersing into a 10%, by weight, toluene polycarbonate solution, and the toluene is evaporated under vacuum.

A photo-voltaic cell is obtained having printed lines which are 2 $\mu$m wide and 0.2 $\mu$m thick. The metal layer adheres to the substrate surface so effectively that it cannot be removed from the surface using a Tesa film produced by Beiersdorf AG, Hamburg.

EXAMPLE 2

A round disc, diameter 5 cm, of an n- and p-doped photo-voltaic element specified in Example 1 is covered with a template which has comb-shaped and rectangular free areas, 0.8 $\mu$m wide, and is printed with a 10%, by weight, solution of styrene butadiene copolymer in methylene chloride. After hardening, the disc is immersed into an activation solution consisting of 1.85 g of 9-octadecen-1-ol palladium dichloride in 1 l of methanol, and then nickel-plated according to Example 1 in a chemical nickel bath. Thereupon, the mask is removed from the test body with methylene chloride.

A photo-voltaic element is obtained having electrically conducting lines being 0.8 $\mu$m wide and 0.2 $\mu$m thick.

EXAMPLE 3

An n- and p-doped Cu/CuGaSe$_2$ cell having a photo-voltaic effect is provided with a methanol-insoluble mask on the CuGaSe$_2$ layer according to Example 1, so that the cell has free continuous semi-circular, triangular, comb-shaped and rectangular lines. After the mask has dried and after activation according to Example 1, the cell is copper-plated without current and at 35° C. in an aqueous copper-plating bath which, in 1 liter, contains 10 g of CuSO$_4$, 15 g of Seignette salt, 20 ml of 25%, by weight, formalin, and is adjusted to pH from 12 to 13 using 32%, by weight, NaOH solution. A photo-voltaic element is obtained which is provided with 2 $\mu$m wide electrically conducting lines.

EXAMPLE 4

A round photo-voltaic cell, diameter 2.5 cm, of a metallic carrier plate and double-layer n-/p-doped gallium arsenide is printed on the side facing the sunrays with a palladium diene-complex containing 12%, by weight, methylethyl ketonic oligomeric polyester solution, in the form of 50 $\mu$m wide printed lines. After the activation layer has dried, the cell is provided with ~50 $\mu$m wide and ~0.23 mm thick Ni lines in a chemical nickel-plating bath over a period of 20 minutes according to Example 1.

A continuously contacted photo-voltaic element is obtained. The electrical resistance of the printed lines is so poor that they are increased in thickness to about 4 $\mu$m using galvanic copper in a conventional aqueous galvanic copper-plating bath containing, per liter, 200 g of CuSO$_4$.5H$_2$O and 30 g of H$_2$SO$_4$ ($\delta$=1.84 g/cm$^3$), connected as cathode, at 0.1 amps.

The palladinized oligomer is obtained as follows:

12 g of diene-containing polyester having 42% by weight, of unsaturated fatty acids and a molecular weight ($\overline{M}_n$) of 780 are mixed by ligand exchange with 1.0 g of acetonitrile palladium dichloride in 150 ml of dimethyl formamide at ~40° C., over a period of 80 minutes, and the acetonitrile and dimethyl formamide are then removed from the polymer at 40° C. under high vacuum.

EXAMPLE 5

The cell specified in Example 4 is provided with a mask according to Example 1, is activated, nickel-plated over a period of 2 minutes and then gold-plated in a conventional chemical gold-plating bath.

A partly gold-plated photo-voltaic element is obtained having electrically conducting lines which are inert to conventional oxidants.

EXAMPLE 6

A 4×2.5 cm n- and p-doped semiconductor cell of Cu$_2$S/CdS is printed with a solution of 18 g of palladinised polybutadiene of a molecular weight ($\overline{M}_n$) of 900, and 5.2%, by weight, of palladium (based on dry polymer mass) in 1 liter of methylene chloride in the form of 3.5 $\mu$m wide continuous comb-shaped lines, freed from the solvent under vacuum and nickel-plated according to Example 1. A solar cell is obtained which is provided with electrically conducting lines. These printed conductors are about 3.5 $\mu$m and about 0.2 $\mu$m thick.

EXAMPLE 7

An n- and p-doped 5×5 cm silicon cell having a photo-voltaic effect is provided with a transparent electrically conducting 4.6×10$^3$ Å thick, In$_2$O$_3$/SnO$_2$ layer of a resistance of 21$\Omega$ per square, is activated according to Example 1, provided with a mask, metallized and freed from the template on the surface. A solar cell having electrically conducting lines is obtained.

EXAMPLE 8

The cell described in Example 1 is sprayed with a UV hardenable lacquer based on oligomeric 1,4-polyisoprene (~15% by weight, in xylene) with photosensitive diazole initiator, the lacquer layer is covered with a mask and hardened by UV radiation. The unhardened lacquer proportion is removed from the test body after removing the mask. After drying, the sample thus provided with 70 $\mu$m wide free lines is activated and metallised according to Example 1.

A solar cell is obtained which is provided with 0.2 $\mu$m thick and 70 $\mu$m wide electrically conducting lines.

EXAMPLE 9

A 2×2 mm square of an alternating, n-p/n-p-doped, 0.1 mm thick silicon plate is activated using the activation bath specified in Example 1, over a period of 30 seconds, the edges of the plate are provided with a 10%, by weight, polycarbonate solution in methylene chloride and, after the methylene chloride has evaporated, is metallized in a chemical nickel-plating bath containing dimethylaminoborane as the reducing agent, over a period of 15 minutes.

The thus-deposited 0.1 $\mu$m thick Ni layer is increased in thickness to 15 $\mu$m in a galvanic gold-plating bath at 0.5 amp/dm$^2$.

A metal-semiconductor-metal-composite material is obtained which may be used as a thyristor.

EXAMPLE 10

A round 0.4 mm thick disc, diameter 18 mm, of an n-type semiconductor based on germanium is activated in an activation bath consisting of 0.5 g of 4-cyclohexene-1,2-dicarboxylic acid anhydride palladium dichloride and 1 liter of $CH_2Cl_2$, over a period of 20 seconds, and then provided with a 0.18 μm thick Ni layer according to Example 1, over a period of 8 minutes.

EXAMPLE 11

A plate of an n-p-doped semiconductor with dimensions of 4×4×0.1 mm, based on silicon, which is attached to an $SiO_2$ plate is printed on both sides with a template according to Example 1 and, after drying, is nickel-plated in a chemical manner according to Example 1, and then freed from the mask.

A non-conductor-semiconductor-composite material is obtained having electrically conducting lines 0.8 μm wide and 0.2 μm thick.

EXAMPLE 12

A p-semiconductor plate with dimensions of 1.2×1.0×0.2 mm, based on silicon is covered on one side with the activator specified in Example 6, in the form of 30 μm wide, continuous lines, and, after drying, nickel-plated according to Example 1, and the nickel-free side is provided with a 5 μm thick $SiO_2$ layer.

An electronic element of metal-semiconductor-insulator is obtained.

We claim:

1. Semiconductors metallised on the surface, characterised in that the metal layer is applied, without previous pickling, by activating with organometallic compounds of metals of Groups IB and VIII of the Periodic Table of Elements, by reduction and currentless wet-chemical metallisation.

2. Metallised semiconductors according to claim 1, wherein the semiconductors consist essentially of silicon, germanium, gallium, arsenic, IIIA-VA or IIB-VIA compounds.

3. Metallised semiconductors according to claim 1, wherein there are photo-voltaic elements based on gallium arsenide.

* * * * *